(12) United States Patent
Lee

(10) Patent No.: US 7,821,309 B2
(45) Date of Patent: Oct. 26, 2010

(54) DELAY LOCKED LOOP CIRCUIT

(75) Inventor: Dong-Jin Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 154 days.

(21) Appl. No.: 11/977,352

(22) Filed: Oct. 24, 2007

(65) Prior Publication Data

US 2008/0100356 A1  May 1, 2008

(30) Foreign Application Priority Data

Oct. 25, 2006  (KR)  ............... 10-2006-0104029

(51) Int. Cl.
*H03L 7/06* (2006.01)
(52) U.S. Cl. .................. 327/158; 327/149; 327/161
(58) Field of Classification Search .............. 327/149, 327/158, 161
See application file for complete search history.

(56) References Cited

U.S. PATENT DOCUMENTS

| | | | |
|---|---|---|---|
| 5,969,551 A | 10/1999 | Fujioka | |
| 6,628,154 B2 * | 9/2003 | Fiscus | 327/158 |
| 7,072,433 B2 * | 7/2006 | Bell | 375/376 |
| 7,078,950 B2 * | 7/2006 | Johnson | 327/158 |
| 7,154,978 B2 | 12/2006 | Juan et al. | |
| 7,336,752 B2 * | 2/2008 | Vlasenko et al. | 375/376 |
| 7,525,354 B2 * | 4/2009 | Gomm et al. | 327/158 |
| 2002/0079937 A1 * | 6/2002 | Xanthopoulos | 327/158 |
| 2006/0176096 A1 * | 8/2006 | Dreps et al. | 327/262 |

FOREIGN PATENT DOCUMENTS

| | | |
|---|---|---|
| KR | 10-1997-0051253 | 7/1997 |
| KR | 1998-0086434 | 12/1998 |
| KR | 10-1999-0042341 | 6/1999 |
| KR | 10-2005-0039727 | 4/2005 |
| KR | 10-2006-0013204 | 2/2006 |
| WO | WO 03/041276 | 5/2003 |

* cited by examiner

*Primary Examiner*—Lincoln Donovan
*Assistant Examiner*—Patrick O'Neill
(74) *Attorney, Agent, or Firm*—Mills & Onello, LLP

(57) ABSTRACT

A delay locked loop (DLL) circuit has a first delay line that delays a received external clock signal for a fine delay time and then outputs a first internal clock signal; a duty cycle correction unit that corrects a duty cycle of the first internal clock signal and then outputs a second clock signal; a second delay line that delays the second clock signal for a coarse delay time and then outputs a second internal clock signal; and a phase detection and control unit that detects the difference between the phases of the external clock signal and the fed back second internal clock signal, and controls the fine delay time and the coarse delay time. The DLL circuit performs coarse locking and fine locking by using different type delay cells, and thus consumes a small amount of power and robustly withstands jitter and variation in PVT variables.

16 Claims, 5 Drawing Sheets

DELAY LOCKED LOOP CIRCUIT

CROSS-REFERENCE TO RELATED PATENT APPLICATIONS

This application claims priority under 35 U.S.C. 119 to Korean Patent Application No. 10-2006-0104029, filed on Oct. 25, 2006, in the Korean Intellectual Property Office, the disclosure of which is incorporated herein in its entirety by reference.

BACKGROUND OF THE INVENTION

1. Field of the Invention

The present invention relates to a delay locked loop (DLL) circuit, and more particularly, to a DLL circuit that can operate at high speeds while reducing power consumption.

2. Description of the Related Art

A DLL circuit is included in a semiconductor memory device to perform phase adjustment so that an internal clock signal input to or output from the DLL circuit can be synchronized with an external clock signal. A DLL performs signal synchronization by delaying a signal input to or output from the DLL according to an external clock signal via a delay line.

FIG. 1 is a circuit diagram of a conventional delay locked loop (DLL) circuit 100. Referring to FIG. 1, the DLL circuit 100 includes a delay line 101, a duty cycle correction (DCC) circuit 120, a phase detection and control circuit 130, and a replica delay path 135.

The phase detection and control circuit 130 compares the phase of an external clock signal Ext_CLK with that of a corrected clock signal CCLK, and detects the phase difference between the external clock signal Ext_CLK and the corrected clock signal CCLK based on the phase of the external clock signal Ext_CLK. Then the phase detection and control circuit 130 transmits information regarding the detected phase difference to the phase mixer 150 so that the external clock signal Ext_CLK can be delayed by the detected phase difference in the phase mixer 150.

The delay line 101 generates an internal clock signal Int_CLK by delaying the external clock signal Ext_CLK for a predetermined amount of time, in response to the output of the phase detection and control circuit 130. The delay line 101 includes a delay circuit 110 and a phase mixer 150.

The delay circuit 110 includes a plurality of delay cells 114, 116, ..., 118, and generates a plurality of clock signals D_0 through D_n by delaying the external clock signal Ext_CLK input to the delay circuit 110 at regular intervals. Whenever the external clock signal Ext_CLK passes through one delay cell, e.g., the delay cell 114, the external clock signal Ext_CLK is delayed for a time t1 and then is output to the phase mixer 150. The delay circuit 110 can further include a buffer 112 in front of the delay cells 114, 116, ..., 118. Thus, the original external clock signal Ext_CLK that is not delayed is output to the phase mixer 150 as a first delayed signal D_0, and the result of delaying the external clock signal Ext_CLK by a time t1 is output to the phase mixer 150 as a second delayed signal D_1. If n delay cells are included, a signal generated by delaying the original external clock signal Ext_CLK by a time t1×n is output to the phase mixer 150 as an nth delayed signal D_n.

The phase mixer 150 receives the delayed signals D_0 through D_n from the delay circuit 110 and then selects one of the delayed signals D_0 through D_n, for example, a delayed signal D_i, and outputs the delayed signal D_i as the internal clock signal Int_CLK. The phase mixer 150 can be a multiplexer.

The DCC circuit 120 cancels and corrects a duty cycle error present in each received internal clock signal Int_CLK and then outputs a corrected clock signal CCLK whose duty cycle is maintained at a normal level (in general, a signal having a duty ratio of 50%:50%. The DCC circuit 120 includes an amplification unit 122, a charge pump 124, and a digital-to-analog converter (DAC) 126.

The amplification unit 122 adjusts the duty cycle of the internal clock signal Int_CLK in response to a control signal VC output from the charge pump 124.

The charge pump 124 adjusts the voltage of the control signal VC in response to the corrected clock signal CCLK received via the replica delay path 135.

The DAC 126 is installed in order to prevent duty cycle information from being erased in a power down mode of a memory device, such as a dynamic random access memory (DRAM). In the power down mode of a DRAM, power supply to the DCC circuit 120 is discontinued. If power supply is discontinued, a self-refresh operation of a memory cell is stopped and thus information stored in the memory cell is likely to be erased due to discharge of a capacitor. Thus the DAC 126 transforms the duty cycle information memorized in a voltage format into a digital signal and then stores the digital signal in order to prevent the duty cycle information from being erased. That is, the duty cycle information is latched in order to memorize it.

The replica delay path 135 compensates for a delay occurring in a first path PATH1 via which the corrected clock signal CCLK is transmitted from a first node N1 to a destination circuit (not shown) that actually uses the corrected clock signal CCLK. The internal clock signal CCLK adjusted by the DLL circuit 100 for signal synchronization is delayed again during movement to the destination circuit that actually uses the internal clock signal CCLK. Thus, the replica delay, path 135 is included in order to compensate for the delay in the first path PATH1. The phase of a delayed corrected clock signal CCLK_D is the same as that of a clock signal CLK_out transmitted to the destination circuit. The replica delay path 135 includes a plurality of delay cells (not shown) causing a delay equivalent to the delay occurring in the first path PATH1.

In the case of the conventional DLL circuit 100, the external clock signal Ext_CLK is first transmitted to the phase detection and control circuit 130. The phase detection and control circuit 130 compares the phases of the external clock signal Ext_CLK and the fed back delayed corrected clock signal CCLK_D and the phase difference therebetween. Information regarding the detected phase difference is transmitted to the phase mixer 150 in the delay line 101. The delay line 101 adjusts a rough delay, i.e., it performs coarse locking, according to the received information regarding the phase difference. Through rough delay adjustment (first delay), the internal clock signal Int_CLK approximates the external clock signal Ext_CLK.

If the internal clock signal Int_CLK on which coarse locking has been performed passes through the DCC circuit 120, the duty cycle of the internal clock signal Int_CLK is corrected and then output as the corrected clock signal CCLK. The corrected clock signal CCLK passing through the replica delay path 135 is delayed for the delay time in the first path path1. The phase detection and control circuit 130 compares the delayed corrected clock signal CCLK_D with the original external clock signal Ext_CLK and detects a fine delay time (second delay). Information regarding the detected fine delay time (second delay) is transmitted to the phase mixer 150. The phase mixer 150 precisely delays the external clock signal Ext_CLK for the detected fine delay time (second delay) and outputs a precisely adjusted internal clock signal Int_CLK.

The precisely adjusted internal clock signal Int_CLK is delayed by the replica delay path 135 and then is fed back to the phase detection and control circuit 130. The phase detection and control circuit 130 compares the internal clock signal Int_CLK that was precisely adjusted and delayed with an external clock signal. If the internal clock signal Int_CLK coincides with the external clock signal, the delay line 101 discontinues signal delay.

FIG. 2 is a circuit diagram illustrating the conventional delay cells 114, 116, 118 illustrated in FIG. 1. Referring to FIG. 2, each of the conventional delay cells 114, 116, ..., 118 includes an even-numbered plurality of inverters 201 connected in series. The original signal input to the delay cells 114, 116, 118 is delayed while passing through the chain of two or even-numbered inverters 201 connected in series in each of the conventional delay cells 114, 116, ..., 118, and then is output. The conventional delay cells 114, 116, ..., 118, being inverter chain-type delay cells, have an advantage of consuming less power than other type delay cells, e.g., differential amplifier type delay cells. The type of the conventional delay cells 114, 116, ..., 118 is not limited. For example, the conventional delay cells 114, 116, ..., 118 can be delay cells (not shown) using differential amplifiers.

A conventional DLL performs coarse locking and fine locking by using delay cells, such as the delay cells 114, 116, ..., 118.

However, all n delayed signals D_1 through D_n that are respectively output from the conventional delay cells 114, 116, ..., 118 are supplied to the phase mixer 150 of FIG. 1. Here, n is a large value that is precisely determined according to a maximum signal delay time. Thus, the more complex the relationship among signals that are input to and output from the phase mixer 150, the greater the signal loading is.

Accordingly, in the case of the conventional DLL circuit 100 illustrated in FIG. 1 that uses inverter type delay cells, power consumption can be reduced but signal loading is increased. Also, the signal mixing performance of the phase mixer 150 is degraded, thus increasing jitter in a plurality of delayed signals D_i. Also, the inverter type delay cells are greatly influenced by signal change caused by variation in power, voltage, and temperature (PVT) variables.

In general, the faster a DRAM operates, the greater the jitter. However, a DRAM operating at high speeds must have a small jitter value in order to precisely transmit data. Thus the extent of jitter must be reduced.

A delay cell using differential amplifiers is constructed by connecting differential amplifiers in series and thus can effectively combat jitter and can robustly withstand variation in the PVT variables. Accordingly, a delay cell using differential amplifiers can be used instead of the inverter type delay cell that has a delay jitter problem and is significantly affected by variation in the PVT variables.

However, the differential amplifier type delay cell consumes a large amount of power. Also, since the relationship among signals that are input to and output from the delay cell is complex, the signal loading on the delay cell is increased. Accordingly, the high-speed operation of a semiconductor device, such as a DRAM, is limited.

SUMMARY OF THE INVENTION

In accordance with the present invention there is provided a delay locked loop (DLL) circuit that is capable of performing coarse locking and fine locking by using different type delay cells, and thus consumes a small amount of power, effectively combats jitter, and robustly withstands variation in power, voltage, and temperature (PVT) variables.

According to an aspect of the present invention, provided is a delay locked loop circuit comprising: a first delay line configured to delay a received external clock signal for a fine delay time and then output a first internal clock signal; and a second delay line configured to delay the second clock signal for a coarse delay time and then output a second internal clock signal, wherein the first delay line and the second delay line are sequentially arranged, and the second clock signal is generated using the first internal clock signal.

A delay cell of the first delay line can comprise a differential amplifier.

A delay cell of the second delay line can comprise an inverter.

The delay locked loop circuit can further comprise a phase detection and control unit configured to detect a difference between the phases of the external clock signal and the fed back second internal clock signal, and to control the fine delay time and the coarse delay time.

The delay locked loop circuit can further comprise a replica delay path arranged between an output terminal of the second delay line and the phase detection and control unit, and configured to compensate for a delay occurring during transmission of the second internal clock signal to a target circuit which uses the second internal clock signal.

The first delay line can include a number of delay cells in a range of 2 through 5.

An ith delay cell in the first delay line can comprise: a first differential amplifier configured to respectively receive the (i−1)th finely delayed signal output from an (i−1)th delay cell in the first delay line and an inverted signal of the (i−1)th finely delayed signal via two input terminals of the first differential amplifier, differentially amplify the (i−1)th finely delayed signal and the inverted signal of the (i−1)th finely delayed signal, and then output the amplified signals; and a second differential amplifier configured to respectively receive the amplified signals from both output terminals of the first differential amplifier via two input terminals of the second differential amplifier, differentially amplify the amplified signals, and then output the ith finely delayed signal and an inverted signal of the ith finely delayed signal via both output terminals of the second differential amplifier, wherein the first and second differential amplifiers operate in response to a first selection signal.

The phase detection and control unit can be configured to perform a phase comparison to determine if the first selection signal is at a logic high or logic low.

The first differential amplifier of the ith delay cell can comprise: a first MOS transistor having a drain connected to a power supply source configured to supply a high voltage, and configured to receive the (i−1)th finely delayed signal via a gate thereof; a first inversion MOS transistor having a drain connected to the power supply source, and configured to receive the inverted signal of the (i−1)th finely delayed signal via a gate thereof; a first selection MOS transistor having a drain connected to a source of the first MOS transistor, and configured to receive the first selection signal via a gate thereof; and a first bias transistor having a drain connected to the first selection transistor and a source connected to a ground voltage source, and configured to receive a first bias signal via a gate thereof. The second differential amplifier of the ith cell of the first delay cells can comprise: a second MOS transistor having a drain connected to the power supply source and a gate connected to the drain of the first MOS transistor, and configured to output the ith finely delayed signal via the drain of the second MOS transistor; a second inversion MOS transistor having a drain connected to the power supply source and a gate connected to the drain of the first inversion MOS transistor, and configured to output the inverted signal of the ith finely delayed signal via the drain of the second MOS transistor; a second selection MOS transistor having a drain connected to the source of each of the second MOS transistors, and configured to receive the first selection signal via a gate of the second selection MOS transistor; and a second bias transistor having a drain connected to the source of the second selection MOS transistor and a source connected to the ground voltage source, and configured to receive the first bias signal via a gate of the second bias transistor.

The first bias signal can be supplied in order to bias the first and second differential amplifiers.

The first differential amplifier of the ith delay cell further can comprise: a first resistor connected between the drain of the first MOS transistor and the power supply source; and a second resistor connected between the drain of the first inversion MOS transistor and the power supply source. The second differential amplifier of the ith cell of the first delay cells can further comprise: a third resistor connected between the drain of the second MOS transistor and the power supply; and a fourth resistor connected between the drain of the second inversion MOS transistor and the power supply source.

The first delay line can comprise: a first delay circuit including n delay cells connected in series; and a phase mixer configured to select at least one of the external clock signal and first through nth finely delayed signals and then output a signal generated by using the selected signal as the first internal clock signal, in response to information regarding the detected phase difference and an output of the phase detection and control unit.

The phase mixer can comprise a multiplexer.

A kth delay cell in the second delay line can comprise: a first inverter configured to receive a signal output from a (k−1)th delay cell; and a second inverter having an input terminal connected to an output terminal of the first inverter, and configured to output a kth coarsely delayed signal via an output terminal thereof.

The delay locked loop circuit of claim 14, wherein the kth delay cell can comprise: the first inverter having an input terminal connected to an output terminal of a second inverter of the (k−1) cell of the second delay cells, and an output terminal connected to the input terminal of the second inverter of the kth cell of the second delay cells; the second inverter configured to output the kth coarsely delayed signal via an output terminal thereof; a first inversion selection transistor having a first terminal connected to the power supply source and a second terminal connected to a first bias terminal of the first inverter, and configured to receive an inverted signal of the second selection signal via a gate thereof; a first selection transistor having a first terminal connected to a second bias terminal of the first inverter and a second terminal connected to the ground voltage source, and configured to receive the second selection signal via a gate thereof; a second inversion selection transistor having a first terminal connected to the power supply source and a second terminal connected to a first bias terminal of the second inverter, and configured to receive the inverted signal of the second selection signal via a gate thereof; and a second selection transistor having a first terminal connected to a second bias terminal of the second inverter and a second terminal connected to the ground voltage source, and configured to receive the second selection signal via a gate thereof.

The first and second inverters can be configured to operate in response to a second selection signal.

The phase detection and control unit can be configured to perform a phase comparison to determine if the second selection signal is at a logic high or logic low.

The delay locked loop circuit can further comprise a duty cycle correction unit configured to correct a duty cycle of the first internal clock signal and then output a second clock signal.

The duty cycle correction unit can comprise: a charge pump configured to output a control signal configured to correct a duty cycle of the first internal clock signal to an amplification unit, in response to the second internal clock signal; the amplification unit configured to compensate for the duty cycle of the first internal clock signal and to output the corrected signal, in response to the control signal; and a digital-to-analog converter configured to transform information regarding a duty cycle of the second internal clock signal into a digital signal and then store the digital signal, for a memory device power down mode.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF EXEMPLARY EMBODIMENTS

Figure 1:
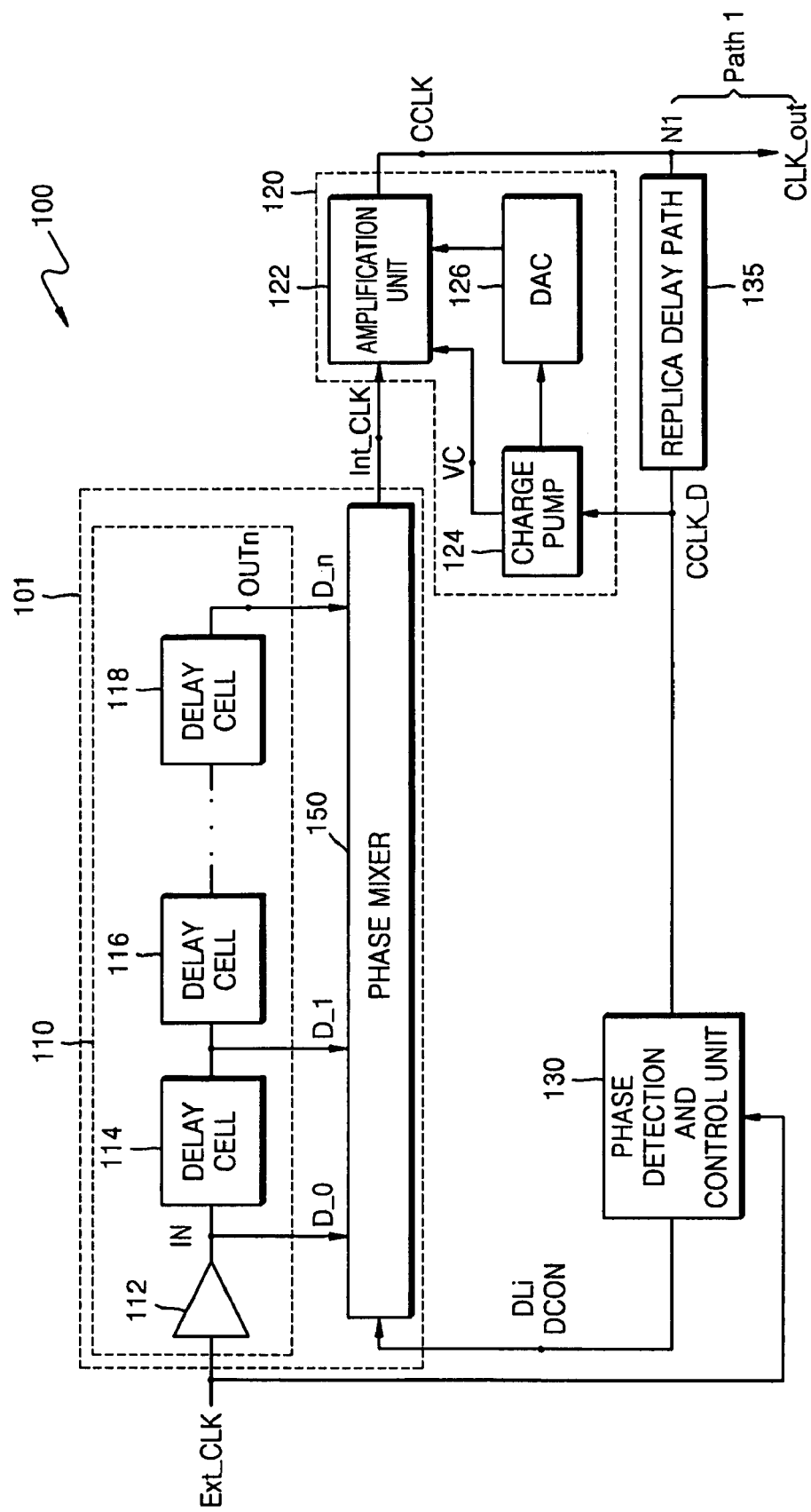
FIG. 1 is a block diagram of a conventional delay locked loop (DLL) circuit.
Figure 2:
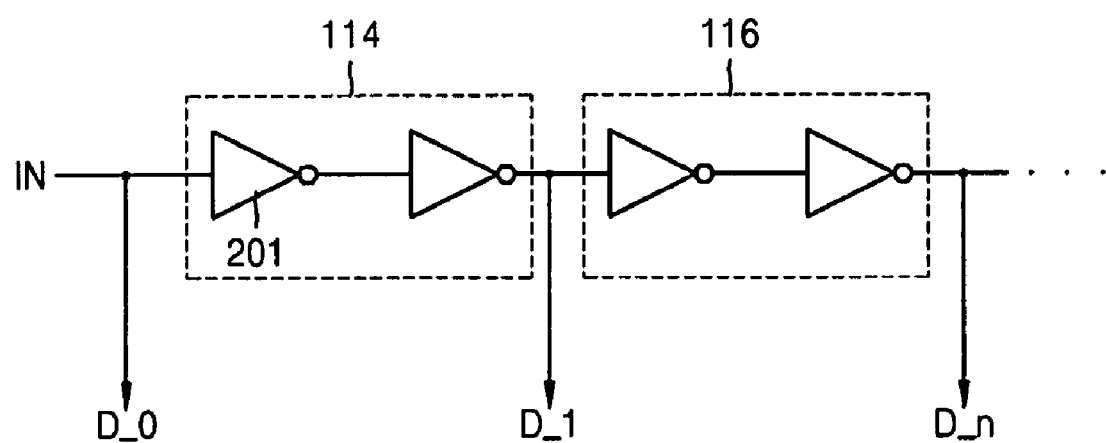
FIG. 2 is a detailed circuit diagram of delay cells of the DLL circuit illustrated in FIG. 1.

Hereinafter, aspects of the present invention will be described by explaining illustrative embodiments in accordance therewith, with reference to the accompanying drawings. Like reference numerals denote like elements throughout the drawings.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Figure 3:
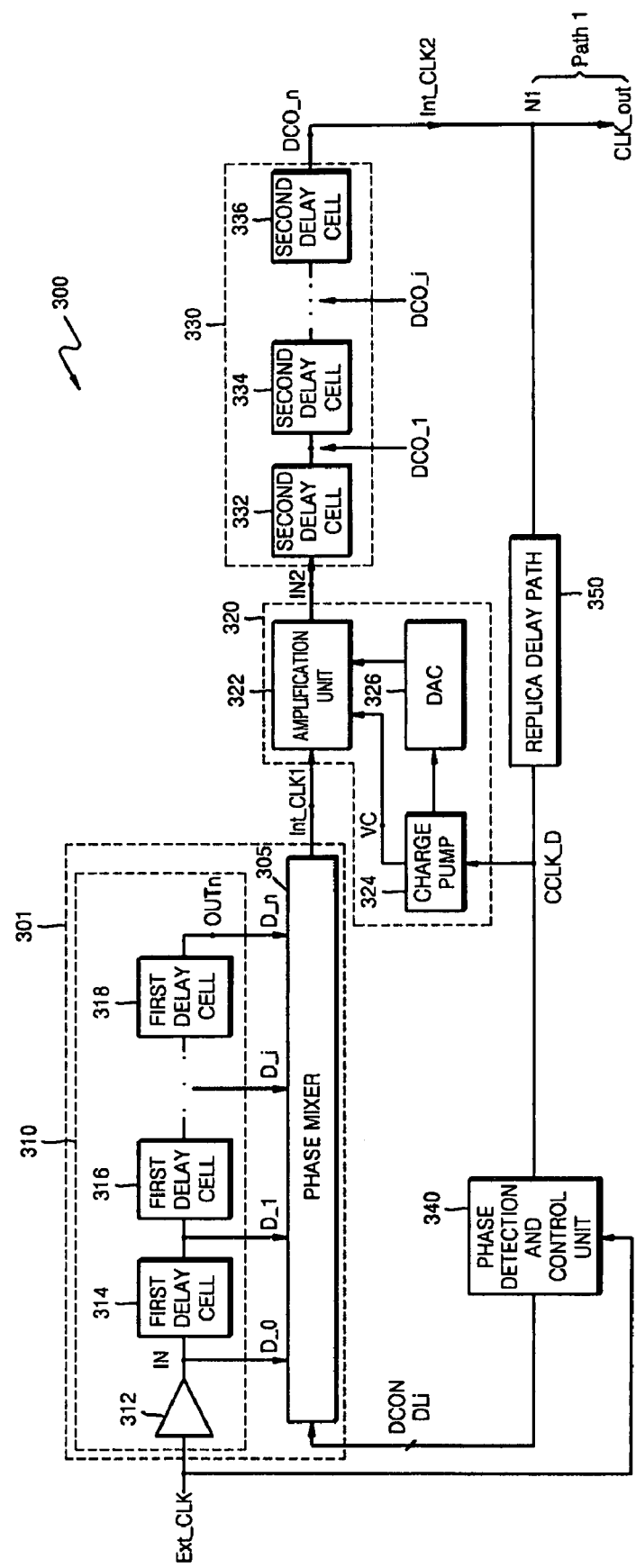
FIG. 3 is an embodiment of a block diagram of a DLL circuit according to an aspect of the present invention.

FIG. 3 is a block diagram of a delay locked loop (DLL) circuit 300 according to an aspect of the present invention. Referring to FIG. 3, the DLL circuit 300 includes a first delay line 301, a duty cycle correction (DCC) unit 320, a second delay line 330, a phase detection and control unit 340, and a replica delay circuit 350.

The operations and structure of the DCC unit 320 and the replica delay circuit 350 are the same as those of the DCC unit 120 and the replica delay circuit 135 of the conventional DLL circuit 100 illustrated in FIG. 1 and thus a detailed description thereof will not be provided here.

The phase detection and control unit 340 compares the phase of an external clock signal Ext_CLK with that of a second internal clock signal Int_CLK2 that is fed back to the phase detection and control unit 340, and detects the phase difference therebetween. Then the phase detection and control unit 340 outputs a delay control signal DCON that is determined to be logic high or logic low depending on the detected phase difference. For example, a user can set a delay control signal DCON that goes high to be output when delay adjustment is needed due to a phase imbalance. Here, the phase detection and control unit 340 transmits a phase difference signal DLi to the phase mixer 305. The phase difference signal DLi contains information regarding the phase difference.

The first delay line 301 includes a first delay circuit 310 and a phase mixer 305. The first delay line 301 delays the external clock signal Ext_CLK for a predetermined delay of time and then outputs it, in response to a signal received from the phase detection and control unit 340. Here, the predetermined delay of time is a time required to perform fine locking.

The first delay circuit 310 includes a plurality of first delay cells 314, 316, 318 connected in series. The first delay circuit 310 can further include a buffer 312 in front of the first delay cells 314, 316, . . . , 318. Here, the external clock signal Ext_CLK before it has been delayed will be referred to as a 0th finely delayed signal D_0, and a signal output from the ith cell will be referred to as an ith finely delayed signal D_i.

The ith finely delayed signal D_i is delayed for a time t1 and then output to the phase mixer 305 whenever it passes through one of the first delay cells 314, 316, . . . , 318. Thus, if n first delay cells 314, 316, . . . , 318 are present, an nth finely delayed signal D_n that is obtained by delaying the external clock signal Ext_CLK for a time t1×n is output to the phase mixer 305.

The first delay circuit 310 is used to perform fine locking. It is possible to perform fine locking even using a small number of delay cells since a delay time for fine locking has a small value. Thus, the total number of delay cells in the first delay circuit 310 is less than in the second delay circuit 330, which will be described later. The total number of first delay cells included in the first delay circuit 310 can be 2 or 3, for example. The phase mixer 305 selects one of a plurality of finely delayed signals D_i received from the first delay circuit 310 and then outputs the selected signal. The signal output from the phase mixer 305 is referred to as a first internal clock signal Int_CLK1.

For example, if the phase of the second internal clock signal Int_CLK2 fed back to the phase detection and control unit 340 advances the phase of the external clock signal Ext_CLK by the time t1, the phase mixer 305 selects and outputs a first finely delayed signal D_1. If the difference between the phases of the fed back second internal clock signal Int_CLK2 and the external clock signal Ext_CLK is not a multiple of the time t1, the phase mixer 305 mixes the finely delayed signals D_i and then outputs the mixing result. The construction and operation of the first delay cell 314 will later be described in detail with reference to FIG. 4.

The DCC unit 320 corrects the duty cycle of the first internal clock signal Int_CLK1 and then outputs a second clock signal IN2.

The second delay line 330 includes a plurality of second delay cells 332, 334, . . . , 336. The second delay line 330 receives the second clock signal IN2, delays it according to coarse locking, and then outputs the second internal clock signal Int_CLK2. For coarse locking, an additional phase mixer is not needed, since delay adjustment is not finely performed and thus mixing of delayed signals is not needed and the amount of delay can be controlled in response to a second selection signal SEL2 (see FIG. 5) that is input under control of the phase detection and control unit 340.

If the total number of the second delay cells 332, 334, . . . , 336 in the second delay line 330 is n, an ith second delay cell from among the n second delay cells 332, 334, . . . , 336 receives and delays an (i−1)th coarsely delayed signal DCO_(i−1) and then outputs an ith coarsely delayed signal DCO_i. For example, the first cell 332 receives the second clock signal IN2 and outputs the first coarsely delayed signal DCO_1, and the nth cell 336 receives the (n−1)th coarsely delayed signal DCO_(n−1) and outputs an nth coarsely delayed signal DCO_n. The constructions and operations of each of the second delay cells 332, 334, . . . , 336 will be described later in detail with reference to FIG. 5.

First, the phase detection and control unit 340 compares the phase of the external clock signal Ext_CLK with that of the fed back second internal clock signal Int_CLK2 and then detects the phase difference therebetween. If a phase difference is present, the DLL circuit 300 begins to operate and then the phase detection and control unit 340 transmits the phase difference signal DLi containing the information regarding the phase difference to the phase mixer 305.

The first delay line 301 receives the external clock signal Ext_CLK and delays the external clock signal Ext_CLK for a constant delay time that is not related to the phase difference signal DLi. That is, fine locking is not performed. The constant delay can be variously set by a user, and can be set to a value of 0 so that the external clock signal_Ext_CLK is output without being delayed. In order not to allow the second delay line 330 to perform fine locking before coarse locking, first, the first delay line 301 creates a signal that is not delayed or is delayed for the constant delay time and then outputs the first internal clock signal Int_CLK1.

Also, the DCC unit 320 corrects the duty cycle of the first internal clock signal Int_CLK1 and outputs the second clock signal IN2. Then the second delay line 330 performs coarse locking based on the phase difference signal DLi received from the phase detection and control unit 340 (although not shown in FIG. 3, it would be apparent to those of ordinary skill in the art that the phase difference signal DLi can be directly transmitted to the second delay line 332 or transmitted via the first delay line 301 and the DCC unit 320).

The second internal clock signal Int_CLK2 output by performing coarse locking is fed back to the phase detection and control unit 340 via the replica delay circuit 350. Then the phase detection and control unit 340 precisely computes a delay time and transmits the phase difference signal DLi to the phase mixer 305. Thereafter, the first delay line 301 performs fine locking on the external clock signal Ext_CLK.

Figure 4:
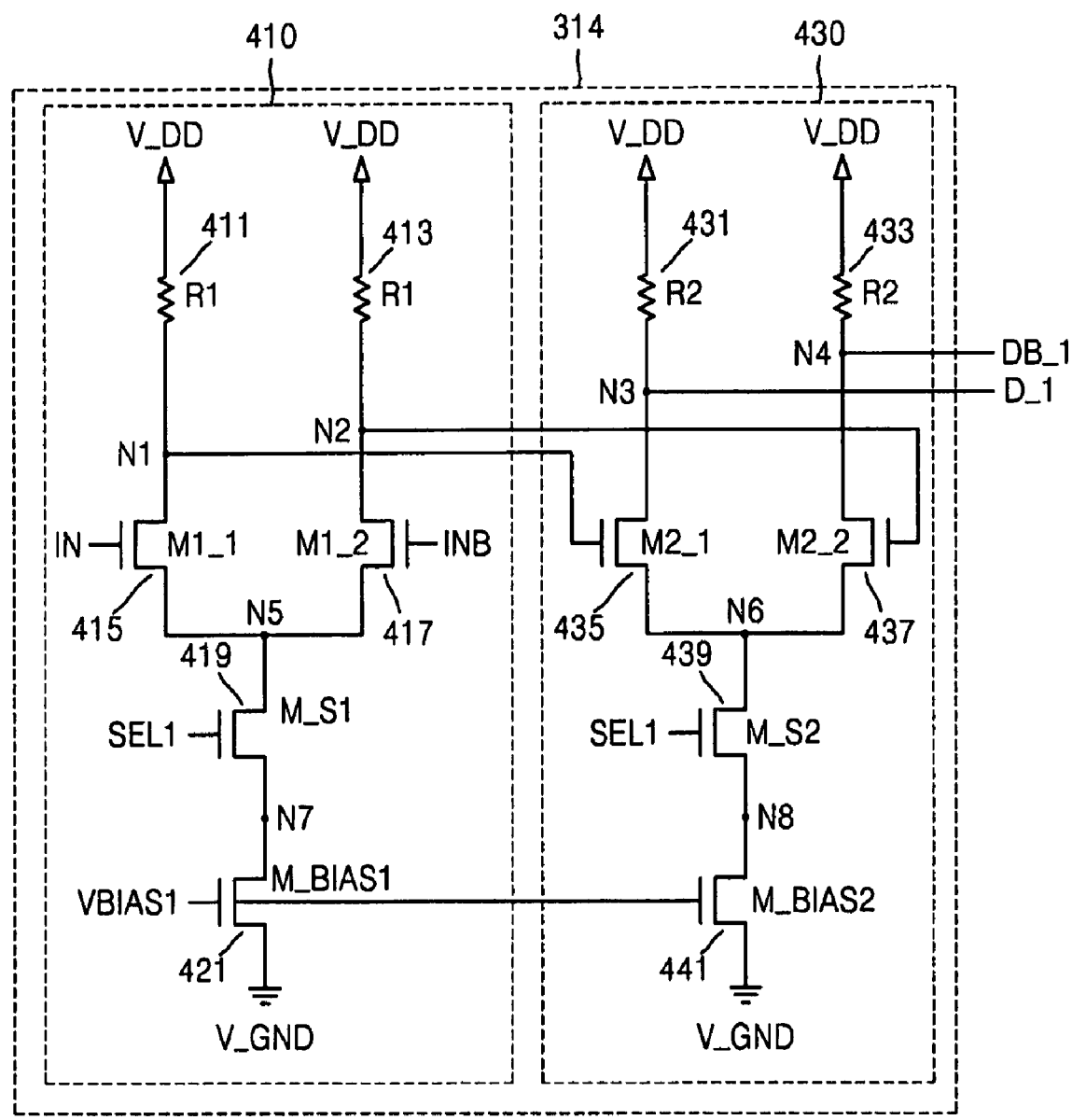
FIG. 4 is a detailed circuit diagram of an embodiment of a first delay cell included in a first delay line of the DLL circuit illustrated in FIG. 3, according to an aspect of the present invention.

FIG. 4 is a detailed circuit diagram of an embodiment of the first delay cell 314 from among the first delay cells 314, 316, . . . , 318 included in the first delay circuit 310 of the DLL circuit 300 illustrated in FIG. 3. The construction and operation of each of the first delay cells 314, 316, . . . , 318 will now be described with respect to the first delay cell 314, as an example.

Referring to FIG. 4, the first delay cell 314 includes first and second differential amplifiers 410 and 430. The first differential amplifier 410 includes a pair of first resistors 411 and 413, a pair of first MOS transistors M1_1 415 and M1_2 417, a first selection MOS transistor M_S1 419, and a first bias transistor M_BIAS1 421. The second differential amplifier 430 includes a pair of second resistors 431 and 433, a pair of second MOS transistors M2_1 435 and M2_2 437, a second selection MOS transistor M_S2 439, and a second bias transistor M_BIAS2 441.

In the first differential amplifier 410, a first terminal of the first resistor 411 is connected to a high voltage source V_DD and a second terminal thereof is connected to a first node N1. A first terminal of the first MOS transistor M1_1 415 is connected to the first node N1 and a second terminal thereof is connected to a fifth node N5. A first terminal of the first resistor 413 is connected to the high voltage source V_DD and a second terminal thereof is connected to a second node N2. A first terminal of the first MOS transistor M1_2 417 is connected to the second node N2 and a second terminal thereof is connected to the fifth node N5.

The drain and source terminals of the first selection MOS transistor M_S1 419 are respectively connected to the fifth node N5 and a seventh node N7, and a first selection signal SEL1 is supplied to the gate terminal thereof. The drain and source terminals of the first bias transistor M_BIAS1 421 are respectively connected to the seventh node N7 and a ground voltage source V_GND, and a first bias signal VBIAS1 is supplied to the gate terminal thereof.

The first differential amplifier 410 respectively receives a first input signal IN and an inverted signal INB of the first input signal via the gate terminals of the first MOS transistors M1_1 415 and M1_2 417, differentially amplifies the first input signal IN and the inverted signal INB, and then outputs the amplified signals. The amplified signals cannot be output unless a first selection signal SEL1 that goes high is applied to turn on the first selection MOS transistor M_S1 419.

In the second differential amplifier 430, a first terminal of the second resistor 431 is connected to high voltage source V_DD and a second terminal thereof is connected to a third node N3. A first terminal of the second resistor 433 is connected to high voltage source V_DD and a second terminal thereof is connected to a fourth node N4. A first terminal of the second MOS transistor M2_1 435 is connected to the third node N3 and a second terminal thereof is connected to a sixth node N6. A first terminal of the second MOS transistor M2_2 437 is connected to the fourth node N4 and a second terminal thereof is connected to the sixth node N6.

The drain and source terminals of the second selection transistor M_S2 439 are respectively connected to the sixth node N6 and an eighth node N8, and the first selection signal SEL1 is supplied to the gate terminal thereof. The drain and source terminals of the second bias transistor M_BIAS2 441 are respectively connected to the eighth node N8 and ground voltage source V_GND, and a first bias signal VBIAS1 is supplied to the gate terminal thereof.

A first finely delayed signal D_1 is output from the drain of the second MOS transistor M2_1 435. An inverted signal DB_1 of the first finely delayed signal D_1 is output from the drain of the second MOS transistor MS_2 437. The first finely delayed signal D_1 is transmitted to the input terminal of a first differential amplifier (not shown) of the second first delay cell 316. The inverted signal DB_1 of the first finely delayed signal D_1 is transmitted to the inversion input terminal of the first differential amplifier of the second first delay cell 316.

A certain amount of time is incurred for the first input signal IN and the inverted signal INB to be supplied to both the input terminals of first differential amplifier 410 and for the signals D_1 and DB_1 to be output from the second differential amplifier 430. Thus, the first delay cell 314 operates as delay cell by using the input and output characteristics of the differential amplifiers 410 and 430.

Here, the logic level of the first selection signal SELL is determined according to the result of phase comparison performed by the phase detection and control unit 340 illustrated in FIG. 3. If the phases of the external clock signal Ext_CLK and the fed back second internal clock signal Int_CLK2 are the same, the first selection signal SEL1 that goes high is applied, thus deactivating the first delay cell 314. If the phases of the external clock signal Ext_CLK and the fed back second internal clock signal Int_CLK2 are different from each other and thus the external clock signal Ext_CLK must be delayed, the first selection signal SELL that goes high is applied, thus activating the first delay cell 314.

The first bias signal VBIAS is a signal that a user inputs in order to bias the first and second differential amplifiers 410 and 430. In general, the operating characteristics of a circuit within a semiconductor device are influenced by variation in power and voltage applied to the circuit and the temperature of the semiconductor device (power, voltage and temperature are referred to as the PVT variables). As illustrated in FIG. 4, if the first bias signal VBIAS1 is applied to the gate terminals of the first and second bias transistors M_BIAS1 421 and M_BIAS2 441, the semiconductor device can be less influenced by variation in the PVT variables.

If delay cells are constructed using differential amplifiers, such as those illustrated in FIG. 4, a DLL circuit having the delay cells can robustly withstand variation in the PVT variables. For example, when the delay cells are activated to operate, a user can apply the first bias signal VBIAS1 that goes high in order to bias the first and second differential amplifiers 410 and 430.

A differential amplifier type delay cell has a good jitter performance when signal mixing is performed. The phase mixer 305 according to the present embodiment performs signal mixing by using the finely delayed signal D_i received from the first delay circuit 310. Accordingly, since signal mixing is performed using a signal output from the differential amplifier type delay cell having the good jitter performance, jitter in the first internal clock signal Int_CLK can be reduced.

The first delay line 301 can include 2 or 3 first delay cells. For fine locking, a signal delay is controlled slightly several times since a small number of delay cells are sufficient to perform fine locking. The total number of differential amplifier type delay cells consuming a large amount of power that are included in a DLL circuit according to the present invention, is less than the total number of delay cells included in the conventional delay circuit 110 illustrated in FIG. 1, thereby minimizing power consumption. That is, the DLL circuit according to the present embodiment includes only 2 or 3 delay cells including differential amplifiers that can robustly withstand disturbance even though they consume a large amount of power, thereby minimizing power consumption.

Also, as described above, the DLL circuit according to aspects of the present invention is less influenced by variation in PVT variables and has a good jitter performance by biasing the differential amplifiers of a delay cell.

Figure 5:
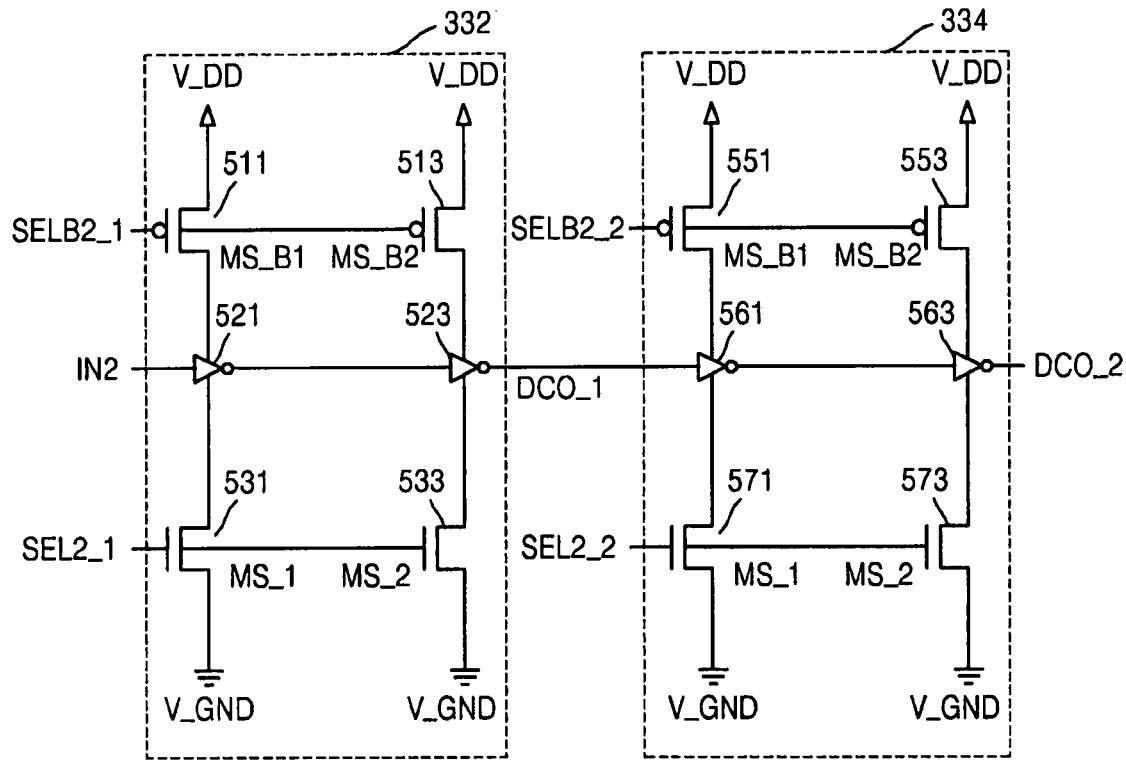
FIG. 5 is a detailed circuit diagram of an embodiment of a second delay cell included in a second delay line of the DLL circuit illustrated in FIG. 3, according to an aspect of the present invention.

FIG. 5 is a detailed circuit diagram of an embodiment of the second delay cells 332 and 334 of the second delay cells 332, 334, . . . , 336 included in the second delay line 330 of the DLL circuit 300 illustrated in FIG. 3. The construction and operation of the first second delay cell 332 will now be described, as an example. The second delay cell 332 includes first and second inverters 521 and 523, first and second inversion selection transistors MS_B1 511 and MS_B2 513, and first and second selection transistors MS_1 531 and MS_2 533.

The first inverter 521 receives a second input signal IN2 via an input terminal thereof. An input terminal of the second inverter 523 is connected to an output terminal of the first inverter 521, and a first coarse delay signal DCO_1 obtained by delaying the second input signal IN2 is output via an output terminal of the second inverter 523.

The drain and source terminals of the first selection transistor MS_1 531 are respectively connected to a first bias terminal of the first inverter 521 and a ground voltage source V_GND, and a second selection signal SEL2_1 is supplied to the gate of the first selection transistor MS_1 531. The drain and source terminals of the second selection transistor MS_2 533 are respectively connected to a first bias terminal of the second inverter 523 and the ground voltage source V_GND, and the second selection signal SEL2_1 is supplied to the gate of the second selection transistor MS_2 533.

A first terminal of the first inversion selection transistor MS_B1 511 is connected to a second bias terminal of the first inverter 521 and a second terminal thereof is connected to a high voltage source V_DD, and a second inverted selection signal SELB2_1 is supplied to the gate of the first inversion selection transistor MS_B1 511. A first terminal of the second inversion selection transistor MS_B2 513 is connected to a second bias terminal of the second inverter 523 and a second terminal thereof is connected to the high voltage source V_DD, and the second inverted selection signal SELB2_1 is supplied to the gate of the first inversion selection transistor MS_B1 513.

The second selection signal SEL2_1 is determined to be at logic high or logic low according to the result of phase comparison performed by the phase detection and control unit 340. It is assumed that a signal is delayed by a time t1 whenever the signal passes through one delay cell. If a delay time is roughly t1, the second selection signal SEL2_1 that goes high is applied only to the first second delay cell 332, and second selection signals SEL2_2 through SEL2_n that go low are applied to the other second delay cells 334, . . . , 336. Then only the first second delay cell 332 operates causing the delay time t1. Here, the second inversion selection signal SELB2_1 is obtained by inverting the phase of the second selection signal SEL2_1.

The total number of delay cells included in the second delay line 330 varies according to the frequency or period of a signal used. The range of delay time in a delay line can be equal to half the period of the signal used. That is, if the phase of an internal clock signal is controlled based on the phase of an external clock signal, the internal clock signal can delayed for half the period thereof in a positive leading direction and a negative lagging direction. For example, if half a period of a signal is 10×t1, the second delay line 330 can include 10 delay cells.

The operations and structures of the second delay cell 334 of FIG. 5 are the same as those of the second delay cell 332, and thus a detailed description thereof will be omitted.

Figure 6:
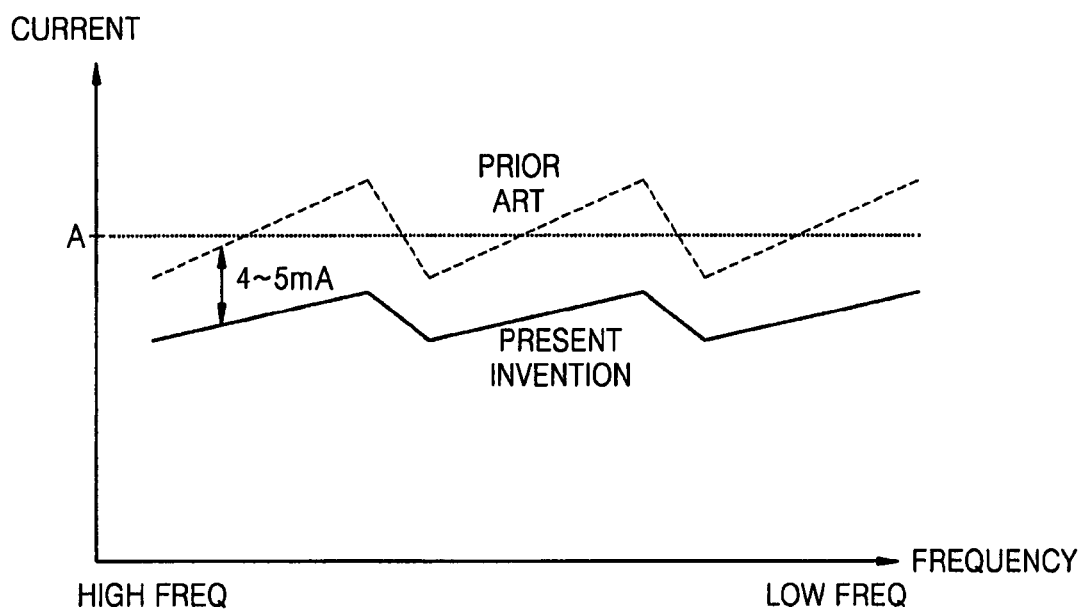
FIG. 6 is a graph illustrating the result of an experiment comparing the amount of current consumed in a DLL circuit according to the present invention with the amount of current consumed in a conventional DLL circuit.

FIG. 6 is a graph illustrating the result of an experiment comparing the amount of current consumed in a DLL circuit according to the present invention with the amount of current consumed in a conventional DLL circuit. Referring to FIG. 6, the amount of current consumed by the DLL circuit according to the present embodiment is smaller by roughly 4 to 5 mA than the amount of current consumed by the conventional DLL circuit. In FIG. 6, an average amount of current consumed can vary according to the scale of a circuit used and the total number of delay cells included in the circuit. That is, the average amount of current does not have a fixed value and thus is indicated with "A" in FIG. 6.

If the amount of current consumed in a high-frequency domain has a small value, the period of a signal is short in the high-frequency domain, that is, the range of maximum delay time is reduced. Thus, it is sufficient to activate only a small number of delay cells, thereby reducing the amount of current consumed. In contrast, if the amount of current consumed in a low-frequency domain has a large value, the period of a signal is long in the low-frequency domain, that is, the range of maximum delay time is increased. Accordingly, a large number of delay cells needs to be activated, thereby increasing the amount of current consumed.

As described above, a DLL circuit according to aspects of the present invention performs coarse locking and fine locking by using different type delay cells, and thus consumes a small amount of power and robustly withstands jitter and variation in the PVT variables.

While embodiments in accordance with the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:
1. A delay locked loop circuit comprising:
a first delay line configured to delay a received external clock signal for a fine delay time and then output a first internal clock signal a second delay line configured to delay a second clock signal for a coarse delay time and then output a second internal clock signal; and a phase detection and control unit configured to detect a difference between the phases of the external clock signal and the second internal clock signal, and to control the fine delay time and the coarse delay time, wherein the first delay line and the second delay line are sequentially arranged, and the second clock signal is generated using the first internal clock signal, wherein a type of a delay cell of the first delay line is different from a type of a delay cell of the second delay line, wherein the type of delay cell is defined by an amount of delay time produced by the delay cell, and wherein the first delay line comprises:

a first delay circuit including n delay cells connected in series; and a phase mixer configured to select at least one of the external clock signal and first through nth finely delayed signals and then output a signal generated by using the selected signal as the first internal clock signal, in response to information regarding the detected phase difference and an output of the phase detection and control unit.

2. The delay locked loop circuit of claim 1, wherein a delay cell of the first delay line comprises a differential amplifier.

3. The delay locked loop circuit of claim 1, wherein a delay cell of the second delay line comprises an inverter.

4. The delay locked loop circuit of claim 1, further comprising a replica delay path arranged between an output terminal of the second delay line and the phase detection and control unit, and configured to compensate for a delay occurring during transmission of the second internal clock signal to a target circuit which uses the second internal clock signal.

5. The delay locked loop circuit of claim 1, wherein the first delay line includes a number of delay cells in a range of 2 through 5.

6. The delay locked loop circuit of claim 5, wherein an ith delay cell in the first delay line comprises:

a first differential amplifier configured to respectively receive the (i−1)th finely delayed signal output from an (i−1)th delay cell in the first delay line and an inverted signal of the (i−1)th finely delayed signal via two input terminals of the first differential amplifier, differentially amplify the (i−1)th finely delayed signal and the inverted signal of the (i−1)th finely delayed signal, and then output the amplified signals; and a second differential amplifier configured to respectively receive the amplified signals from both output terminals of the first differential amplifier via two input terminals of the second differential amplifier, differentially amplify the amplified signals, and then output the ith finely delayed signal and an inverted signal of the ith finely delayed signal via both output terminals of the second differential amplifier, wherein the first and second differential amplifiers operate in response to a first selection signal.

7. The delay locked loop circuit of claim 6, wherein the phase detection and control unit is configured to perform a phase comparison to determine if the first selection signal is at a logic high or logic low.

8. The delay locked loop circuit of claim 6, wherein the first differential amplifier of the ith delay cell comprises:

a first MOS transistor having a drain connected to a power supply source configured to supply a high voltage, and configured to receive the (i−1)th finely delayed signal via a gate thereof;

a first inversion MOS transistor having a drain connected to the power supply source, and configured to receive the inverted signal of the (i−1)th finely delayed signal via a gate thereof;

a first selection MOS transistor having a drain connected to a source of the first MOS transistor, and configured to receive the first selection signal via a gate thereof; and a first bias transistor having a drain connected to the first selection transistor and a source connected to a ground voltage source, and configured to receive a first bias signal via a gate thereof, wherein the second differential amplifier of the ith cell of the first delay cells comprises:

a second MOS transistor having a drain connected to the power supply source and a gate connected to the drain of the first MOS transistor, and configured to output the ith finely delayed signal via the drain of the second MOS transistor;

a second inversion MOS transistor having a drain connected to the power supply source and a gate connected to the drain of the first inversion MOS transistor, and configured to output the inverted signal of the ith finely delayed signal via the drain of the second MOS transistor;

a second selection MOS transistor having a drain connected to the source of each of the second MOS transistors, and configured to receive the first selection signal via a gate of the second selection MOS transistor; and a second bias transistor having a drain connected to the source of the second selection MOS transistor and a source connected to the ground voltage source, and configured to receive the first bias signal via a gate of the second bias transistor.

9. The delay locked loop circuit of claim 8, wherein the first bias signal is supplied in order to bias the first and second differential amplifiers.

10. The delay locked loop circuit of claim 8, wherein the first differential amplifier of the ith delay cell further comprises:

a first resistor connected between the drain of the first MOS transistor and the power supply source; and a second resistor connected between the drain of the first inversion MOS transistor and the power supply source, wherein the second differential amplifier of the ith cell of the first delay cells further comprises:

a third resistor connected between the drain of the second MOS transistor and the power supply; and a fourth resistor connected between the drain of the second inversion MOS transistor and the power supply source.

11. The delay locked loop circuit of claim 1, wherein a kth delay cell in the second delay line comprises:

a first inverter configured to receive a signal output from a (k−1)th delay cell; and a second inverter having an input terminal connected to an output terminal of the first inverter, and configured to output a kth coarsely delayed signal via an output terminal thereof.

12. The delay locked loop circuit of claim 11, wherein the kth delay cell comprises:

the first inverter having an input terminal connected to an output terminal of a second inverter of the (k−1) cell of the second delay line, and an output terminal connected to the input terminal of the second inverter of the kth cell of the second delay line;

the second inverter configured to output the kth coarsely delayed signal via an output terminal thereof;

a first inversion selection transistor having a first terminal connected to the power supply source and a second terminal connected to a first bias terminal of the first inverter, and configured to receive an inverted signal of a second selection signal via a gate thereof;

a first selection transistor having a first terminal connected to a second bias terminal of the first inverter and a second terminal connected to the ground voltage source, and configured to receive the second selection signal via a gate thereof;

a second inversion selection transistor having a first terminal connected to the power supply source and a second terminal connected to a first bias terminal of the second inverter, and configured to receive the inverted signal of the second selection signal via a gate thereof; and a second selection transistor having a first terminal connected to a second bias terminal of the second inverter and a second terminal connected to the ground voltage source, and configured to receive the second selection signal via a gate thereof.

13. The delay locked loop circuit of claim 12, wherein the first and second inverters are configured to operate in response to the second selection signal.

14. The delay locked loop circuit of claim 13, wherein the phase detection and control unit is configured to perform a phase comparison to determine if the second selection signal is at a logic high or logic low.

15. A delay locked loop circuit, comprising:
a first delay line configured to delay a received external clock signal for a fine delay time and then output a first internal clock signal;
a duty cycle correction unit configured to correct a duty cycle of the first internal clock signal and then output a second clock signal; and
a second delay line configured to delay the second clock signal for a coarse delay time and then output a second internal clock signal,
wherein the first delay line and the second delay line are sequentially arranged, and the second clock signal is generated using the first internal clock signal,
wherein a type of a delay cell of the first delay line is different from a type of a delay cell of the second delay line, and
wherein the type of delay cell is defined by an amount of delay time produced by the delay cell.

16. The delay locked loop circuit of claim 15, wherein the duty cycle correction unit comprises:
a charge pump configured to output a control signal configured to correct a duty cycle of the first internal clock signal to an amplification unit, in response to the second internal clock signal;
the amplification unit configured to compensate for the duty cycle of the first internal clock signal and to output the second clock signal, in response to the control signal; and
a digital-to-analog converter configured to transform information regarding a duty cycle of the second internal clock signal into a digital signal and then store the digital signal, for a memory device power down mode.

* * * * *